United States Patent
Yamada et al.

(10) Patent No.: US 12,132,025 B2
(45) Date of Patent: Oct. 29, 2024

(54) BONDING WIRE

(71) Applicants: NIPPON MICROMETAL CORPORATION, Saitama (JP); NIPPON STEEL Chemical & Material Co., Ltd., Tokyo (JP)

(72) Inventors: Takashi Yamada, Saitama (JP); Akihito Nishibayashi, Saitama (JP); Teruo Haibara, Saitama (JP); Daizo Oda, Saitama (JP); Motoki Eto, Saitama (JP); Tetsuya Oyamada, Tokyo (JP); Takayuki Kobayashi, Tokyo (JP); Tomohiro Uno, Tokyo (JP)

(73) Assignees: NIPPON MICROMETAL CORPORATION, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 500 days.

(21) Appl. No.: 17/437,805

(22) PCT Filed: Mar. 12, 2020

(86) PCT No.: PCT/JP2020/010761
§ 371 (c)(1),
(2) Date: Sep. 9, 2021

(87) PCT Pub. No.: WO2020/184654
PCT Pub. Date: Sep. 17, 2020

(65) Prior Publication Data
US 2022/0157766 A1    May 19, 2022

(30) Foreign Application Priority Data
Mar. 13, 2019  (JP) .................................. 2019-045669

(51) Int. Cl.
*H01L 23/00* (2006.01)
*B32B 15/01* (2006.01)
*C21D 9/52* (2006.01)

(52) U.S. Cl.
CPC ............ *H01L 24/45* (2013.01); *B32B 15/017* (2013.01); *B32B 15/018* (2013.01); *C21D 9/525* (2013.01); *H01L 2224/43848* (2013.01); *H01L 2224/45015* (2013.01); *H01L 2224/45124* (2013.01); *H01L 2224/45565* (2013.01); *H01L 2224/45639* (2013.01); *H01L 2224/45644* (2013.01)

(58) Field of Classification Search
CPC ........... H01L 24/45; H01L 2224/45124; H01L 2224/45639; H01L 2224/45644
See application file for complete search history.

(56) References Cited

U.S. PATENT DOCUMENTS

| 2010/0294532 A1 | 11/2010 | Uno et al. |
| 2014/0063762 A1 | 3/2014 | Ryu et al. |

FOREIGN PATENT DOCUMENTS

| CN | 103320654 A | 9/2013 |
| JP | H08-241907 A | 9/1996 |
| JP | 2002-314038 A | 10/2002 |
| JP | 2007-123597 A | 5/2007 |
| JP | 2008-218994 A | 9/2008 |
| JP | 2009-158931 A | 7/2009 |
| JP | 2014-047417 A | 3/2014 |
| JP | 2014-53610 A | 3/2014 |
| JP | 2014-082369 A | 5/2014 |
| JP | 2015-124409 A | 7/2015 |
| WO | 2016/091718 A1 | 6/2016 |

OTHER PUBLICATIONS

International Search Report issued in corresponding International Patent Application No. PCT/JP2020/010761, dated Apr. 14, 2020, with English translation.
J.P. Hou et al., "Micrcrostructure evolution and strengthening mechanisms of cold-drawn commercially pure aluminum wire," Materials Science & Engineering A, vol. 639, May 8, 2015, pp. 103.
Extended European Search Report issued in corresponding European Patent Application No. 20768986.0, dated May 23, 2023.
Taiwanese Office Action issued in corresponding Taiwanese Patent Application No. 109108188, dated Jul. 10, 2023, 1 with English translation.
Written Decision on Registration issued in the corresponding Korean Patent Application No. 10-2021-7028991 dated Aug. 20, 2024, w/English machine translation.

*Primary Examiner* — David A Zarneke
(74) *Attorney, Agent, or Firm* — Rimon P.C.

(57) ABSTRACT

There is provided a metal-coated Al bonding wire which can provide a sufficient bonding reliability of bonded parts of the bonding wire under a high temperature state where a semiconductor device using the metal-coated Al bonding wire is operated. The bonding wire includes a core wire of Al or Al alloy, and a coating layer of Ag, Au or an alloy containing them formed on the outer periphery of the core wire, and the bonding wire is characterized in that when measuring crystal orientations on a cross-section of the core wire in a direction perpendicular to a wire axis of the bonding wire, a crystal orientation <111> angled at 15 degrees or less to a wire longitudinal direction has a proportion of 30 to 90% among crystal orientations in the wire longitudinal direction. Preferably, the surface roughness of the wire is 2 μm or less in terms of Rz.

4 Claims, No Drawings

BONDING WIRE

CROSS-REFERENCE TO RELATED APPLICATIONS

This application is the U.S. National Phase under 35 U.S.C. § 371 of International Application No. PCT/JP2020/010761, filed on Mar. 12, 2020, which claims the benefit of Japanese Application No. 2019-045669, filed on Mar. 13, 2019, the entire contents of each are hereby incorporated by reference.

TECHNICAL FIELD

The present invention relates to a bonding wire, particularly, a metal-coated Al bonding wire in which a coating layer is formed on the surface of an Al core wire.

BACKGROUND ART

In a semiconductor device, electrodes formed on a semiconductor element are connected with lead frames or electrodes on a substrate using a bonding wire. As for a material of the bonding wire, gold (Au) and copper (Cu) are used for an integrated circuit semiconductor device such as an ultra-LSI, while aluminum (Al) is mainly used for a power semiconductor device. For example, Patent Literature 1 discloses an example in which an aluminum bonding wire (hereinafter referred to as "Al bonding wire") with a diameter of 300 μm is used in a power semiconductor module. In a power semiconductor device using an Al bonding wire, a wedge bonding is used as a bonding process for both of the connection with electrodes on semiconductor element and the connection with lead frames or electrodes on substrate.

An Al bonding wire is inexpensive compared to an Au bonding wire, but is prone to be oxidized and deteriorate in high humidity. Thus, the wire needs a vacuum package or a package with inert gas sealed inside, which is expensive, and cannot be adapted to an inexpensive resin package. Further, a power semiconductor device using an Al bonding wire is often used as a semiconductor device for large power equipment such as air conditioner and photovoltaic power generation system, and for automotive. In these semiconductor devices, the bonded parts of Al bonding wire are exposed to high temperatures of 100 to 300° C. Since an Al bonding wire composed only of high purity Al tends to soften in such a high temperature environment, it is difficult to use such Al bonding wire in a high temperature environment. Patent Literature 2 describes a method of manufacturing a gold-coated aluminum bonding wire. The Literature disclosed that the gold-coated aluminum bonding wire can be adapted to an inexpensive resin package, and ball bonding is made possible even though the wire is aluminum wire.

In manufacture of a bonding wire, a wire drawing process using dies is performed. The same applies to Al or Al alloy bonding wires. When drawing an Al or Al alloy bonding wire using dies, abrasion powders of aluminum may be generated due to the abrasion of Al or Al alloy caused by the dies because Al and Al alloy are soft. This abrasion powder may adversely generate flaws on the surface of wire to be drawn thereafter, and cause on-axis eccentricity. As described in Patent Literature 2, since Au is harder than Al, an Au coating on the surface of Al wire can prevent the generation of abrasion powder during wire drawing.

Patent Literature 3 discloses a bonding wire including a core wire of Al or Al alloy, and a coating layer A coating the core wire, in which the metal constituting the coating layer A is Mo, Nb, Cr, Co, Ti, Zr, Ta, Fe or an alloy thereof. The coating layer A prevents the generation of the abrasion powder due to scraping the wire during the wire drawing using dies. Furthermore, the coating metal such as Mo prevent the Al core wire from corrosion even when used to an inexpensive resin package, whereas an Au coating does not prevent the Al core wire from corrosion.

RELATED ART REFERENCE

Patent Literature

Patent Literature 1: JP-A-2002-314038
Patent Literature 2: JP-A-H08-241907
Patent Literature 3: JP-A-2014-82369

SUMMARY OF INVENTION

Problem to be Solved by the Invention

Even for the semiconductor devices using an Al bonding wire including a coating layer like those described in Patent Literatures 1 and 2, sufficient bonding reliability of the bonded parts of the bonding wire was sometimes not achieved under a high temperature state where the semiconductor device was operated.

An object of the present invention is to provide a metal-coated Al bonding wire which achieves sufficient bonding reliability of bonded parts of the bonding wire under a high temperature state where a semiconductor device using the metal-coated Al bonding wire is operated.

Means for Solving Problem

That is, the summary of the present invention is as follows.

[1] A bonding wire comprising:
a core wire of Al or Al alloy; and
a coating layer of Ag, Au or an alloy containing them formed on an outer periphery of the core wire, wherein when measuring crystal orientations on a cross-section of the core wire in a direction perpendicular to a wire axis of the bonding wire, a crystal orientation <111> angled at 15 degrees or less to a wire longitudinal direction has a proportion of 30 to 90% among crystal orientations in the wire longitudinal direction.

[2] The bonding wire according to [1], wherein a surface roughness of the wire is 2 μm or less in terms of Rz.

[3] The bonding wire according to [1] or [2], wherein a thickness of the coating layer is 1 to 100 nm.

[4] The bonding wire according to any one of [1] to [3], wherein a wire diameter is 50 to 600 μm.

Effect of the Invention

The bonding wire of the present invention includes a core wire of Al or Al alloy, and a coating layer of Ag, Au or an alloy containing them formed on the outer periphery of the core wire, and is characterized in that when measuring crystal orientations on a cross-section of the core wire in a direction perpendicular to a wire axis of the bonding wire, a crystal orientation <111> angled at 15 degrees or less to a wire longitudinal direction has a proportion of 30 to 90% among crystal orientations in the wire longitudinal direction. Thus, sufficient bonding reliability of the bonded parts of the bonding wire can be ensured under a high temperature state where a semiconductor device using the bonding wire is operated.

Embodiment for Carrying Out the Invention

The present invention is directed to a metal-coated Al bonding wire including a core wire of Al or Al alloy (hereinafter, may also be simply referred to as an "Al core wire") and a coating layer of Ag, Au or an alloy containing them (hereinafter, may also be simply referred to as "Ag/Au coating layer") formed on the outer periphery of the core wire.

The bonding wire of the present invention includes a core wire of Al or Al alloy as a core wire. In the case where Al is used, the Al content of the core wire is 99.9% by mass or more. In the case where Al alloy is used, an alloy such as Al—Si, Al—Fe or the like is used and the Al content thereof is 90% by mass or more. The components constituting the core wire includes inevitable impurities in addition to Al or the components constituting the Al alloy described above.

The heat treatment during the manufacture of the bonding wire may form a diffusion region between the metal of the coating layer and the metal of the core wire at the boundary between the coating layer and the core wire. In the diffusion region, the content of the metal of the coating layer gradually decreases and the content of the metal of the core wire gradually increases from the coating layer side toward the center of the wire. In the present invention, the position at which the content of the metal of the core wire is 50 at % is defined as the boundary between the coating layer and the core wire. When the diffusion region is formed at the boundary between the core wire and the coating layer, the core wire contains the components of the coating layer in the diffusion region therein, and the content thereof is 50 at % or less.

The component constituting the coating layer includes Ag, Au or an alloy containing them, and further includes inevitable impurities. When using Ag, Au or an alloy containing them for the component constituting the coating layer, good bonding property and high bonding strength can be achieved. In the case where an alloy containing Ag or Au is used, the content of Ag or Au in the alloy is 50% by mass or more, and Al may be contained as the alloy component. In the case where the diffusion region is formed at the boundary between the core wire and the coating layer, the coating layer contains the component of the core wire in the diffusion region therein, and the content thereof is 50 at % or less.

The invention described in Patent Literature 1 using an Au-coated Al bonding wire can be applied to a low-cost resin package, and ball bonding is made possible even though the wire is an Al wire. The invention described in Patent Literature 2 using an Al bonding wire with a coating layer of Mo or the like does not generate abrasion powder due to scraping during wire drawing using dies, and prevents the Al core wire from corrosion even when used to an inexpensive resin package.

As for the semiconductor device using an Ag— or Au-coated Al bonding wire, when the semiconductor device was operated for a long time under a high temperature state, there was observed a phenomenon in which the bonding strength of the bonded parts of the bonding wire decreased. In other words, it was found that sufficient bonding reliability cannot be achieved. According to the observation of the cross-section of the bonding wire in the semiconductor device after long-term operation under a high temperature, it was found that recrystallization occurred and the crystal grain size increased due to a high temperature environment, and a crystal orientation <111> proportion, which will be described later, was reduced. It was therefore inferred that the wire strength was reduced as compared to the initial strength, resulting in an occurrence of peeling phenomenon at the bonding interface and a decrease in the reliability of the bonded parts.

In contrast, the metal-coated Al bonding wire of the present invention includes an Ag/Au coating layer formed on the outer periphery of the Al core wire, and is characterized in that when measuring crystal orientations on a cross-section of the core wire in a direction perpendicular to a wire axis of the bonding wire, a crystal orientation <111> angled at 15 degrees or less to a wire longitudinal direction has a proportion of 30 to 90% among crystal orientations in the wire longitudinal direction. Hereinafter, such proportion of a crystal orientation <111> may also be simply referred to as "crystal orientation <111> proportion". Thus, even when the semiconductor device is continuously operated for a long time under a high temperature environment, it is possible to ensure the reliability of the bonded parts in the semiconductor device after long-term operation under a high temperature. A detailed description will next be given.

There will be described an evaluation test of reliability of the bonded parts after a high-temperature long-term hysteresis.

As a metal-coated Al bonding wire, an Au-coated Al bonding wire and an Ag-coated Al bonding wire were prepared. The coating thickness of the coating layer was 50 nm for each wire. The wire diameter after wire drawing is 200 μm. In the middle of the wire drawing process, some of the wires were subjected to a heat treatment. When the heat treatment was performed, two types of cooling conditions had been employed including slow cooling and quenching. The wires after being drawn were subjected to a thermal refining heat treatment. By varying the condition of heat treatment in the middle of wire drawing and the condition of thermal refining heat treatment after wire drawing, the crystal orientation <111> proportion was variously changed.

In the semiconductor device, both the first bonded part between the semiconductor chip and the bonding wire and the second bonded part between the external terminal and the bonding wire utilized wedge bonding.

The high-temperature long-term hysteresis was performed by power cycle test. The power cycle test involves repeatedly heating and cooling the semiconductor device in which the Al bonding wires are bonded. Specifically, the semiconductor device is heated over 2 seconds until the temperature of the bonded parts of the bonding wires in the semiconductor device becomes 140° C., and then is cooled over 5 seconds until the temperature of the bonded parts becomes 30° C. This heating and cooling cycle is repeated 200,000 times.

After performing the high-temperature long-term hysteresis as noted above, the bonding shear strength of the first bonded part was measured to evaluate the reliability of the bonded part. As a result, when the crystal orientation <111> proportion falls within a range of 30 to 90% (condition of the present invention), both the Au-coated wire and the Ag-coated wire had a bonding shear strength of 90% or more compared to the initial strength, so that the sufficient reliability of the bonded parts could be ensured. On the other hand, when the crystal orientation <111> proportion was out of the condition of the present invention as noted above, the bonding shear strength was less than 50% compared to the initial strength, and the reliability of the bonded parts was insufficient.

<<Crystal Orientation <111> Proportion of Wire>>

When measuring crystal orientations on a cross-section of the core wire in a direction perpendicular to a wire axis of the bonding wire of the present invention, a crystal orientation <111> angled at 15 degrees or less to a wire longitudinal direction has a proportion of 30 to 90% among crystal orientations in the wire longitudinal direction. Herein, the cross-section of the core wire in a direction perpendicular to a wire axis means a cross-section (C-section) perpendicular to the longitudinal direction of the bonding wire. For the measurement of the crystal orientation <111> proportion, EBSD (Electron Back Scatter Diffraction Patterns) can be used. The crystal orientation <111> proportion can be calculated by inspecting the cross-section of the core wire in a direction perpendicular to a wire axis (cross-section perpendicular to the longitudinal direction of the bonding wire) as an inspection surface, and using an analysis software dedicated to the measuring device. Regarding the calculation method of the orientation proportion, the crystal orientation <111> proportion is defined as the areal percentage of crystal orientation <111> which is calculated by using, as a population, only the area where crystal orientation can be identified with a certain reliability within the measurement area. In the process of determining the orientation proportion, there is excluded a portion where crystal orientation cannot be measured or a portion where the reliability of orientation analysis is low even when crystal orientation can be measured.

If the crystal <111> orientation proportion is 90% or less, recrystallization due to the thermal refining heat treatment during wire drawing proceeds moderately, and the wire is softened. Thus, it is possible to prevent the wire from: chip cracking during bonding; having a lower bonding property of the bonded parts; having a decreased reliability during a high-temperature long-term use, and the like. On the other hand, the crystal orientation <111> proportion of less than 30% indicates that the recrystallization of the wire has proceeded too much. Thus, the reliability of the bonded parts is reduced, and the reliability during a high-temperature long-term use is also reduced.

By performing the heat treatment during wire drawing, and quenching after heat treatment in combination with the appropriate coating thickness and the thermal refining heat treatment after wire drawing, the crystal orientation <111> proportion in a cross-section perpendicular to the longitudinal direction of the wire can be adjusted to 30 to 90%. The crystal orientation <111> proportion is preferably 40% or more, and more preferably 50% or more. The crystal orientation <111> proportion is also preferably 80% or less, and more preferably 70% or less.

<<Surface Roughness of Wire>>

In the present invention, it is preferable that the surface roughness of the wire is 2 µm or less in terms of Rz. By forming a coating layer of Ag, Au or an alloy containing them on the surface of the wire and then drawing the wire so that the thickness of the coating layer is 1 nm or more, the surface roughness Rz can be adjusted to 2 µm or less. The surface roughness Rz of 2 µm or less can improve the bonding property to electrodes at the time of bonding. Surface roughness Rz is the maximum height Rz defined in JIS B 0601-2001. This can be evaluated by the roughness in the longitudinal direction of the wire by a non-contact ultra-deep shape measuring microscope.

<<Thickness of Coating Layer>>

In the metal-coated Al bonding wire of the present invention, the thickness of the coating layer is preferably 1 to 100 nm. It can thus prevent a deterioration of die abrasion without generating abrasion powder due to scraping during wire drawing using dies. In addition, it is possible to sufficiently exhibit the effect of reducing the surface roughness Rz of the wire.

If the thickness of the coating layer is too thin, it is impossible to exert an effect of the coating layer formed, thereby impairing die abrasion. Thus, the surface roughness of the wire deteriorates, and as a result, the bonding property to electrodes at the time of bonding deteriorates. When the thickness of the coating layer is 1 nm or more, the function and effects of the coating layer of the present invention can be exhibited. The thickness of the coating layer is more preferably 10 nm or more, and further preferably 20 nm or more.

On the other hand, if the thickness of the coating layer is too thick, the friction during wire drawing is small, and the processing degree of the Al core wire becomes small. Thus, the orientation <111> proportion of the wire decreases. When the thickness of the coating layer is 100 nm or less, the function and effects of the coating layer of the present invention can be exhibited. The thickness of the coating layer is more preferably 40 nm or less, and further preferably 30 nm or less.

When the wire diameter to be described later is defined as D (µm), the thickness d (nm) of the coating layer is preferably more than 0.02D, more preferably 0.03D or more, 0.04D or more, or 0.05D or more. Further, the thickness d (nm) of the coating layer is preferably 0.2D or less, more preferably 0.18D or less, 0.16D or less, or 0.15 D or less. In particular, when the wire diameter D (µm) and the thickness d (nm) of the coating layer satisfy the relation of 0.05D d 0.15D, the above-mentioned effects due to the formation of the coating layer can be remarkably achieved.

<<Wire Diameter>>

In the present invention, the diameter of the bonding wire is preferably 50 to 600 µm. Wires with diameter of 50 µm or more are generally used for power system devices due to a large current flow. Wires with diameter exceeding 600 µm are difficult to handle and no wire bonders are available for them. Thus, wires with diameter of 600 µm or less are used.

<<Components of Wire>>

For the Al bonding wire of the present invention, any of pure Al and an Al alloy can be appropriately applied. The Al alloy may contain an additive element such as Fe, Si, or the like, and examples thereof may include an Al—Fe alloy and an Al—Si alloy. The Al content thereof is preferably 95% by mass or more, 96% by mass or more, 97% by mass or more, 98% by mass or more, or 98.5% by mass or more. Preferable examples of the Al alloy may include an alloy of Al-0.5% by mass Fe and an alloy of Al-1% by mass Si.

<<Method for Manufacturing Bonding Wire>>

First, in accordance with the composition of the core wire, a high-purity Al (purity of 99.99% or higher) and a raw material for an additive element are weighed as starting materials. After that, the starting materials are heated and melted under high vacuum or in an inert atmosphere such as nitrogen or argon, thus obtaining an ingot containing predetermined components with the balance containing Al and inevitable impurities. The ingot is then drawn using metal dies to form the core wire with a finally required diameter.

As a method of forming the coating layer on the surface of the core wire, electrolytic plating, electroless plating, vapor deposition, or the like can be used. From the viewpoint of productivity, it is industrially most preferable to use electrolytic or electroless plating. As to the step of applying the coating layer on the surface of the core wire, it is most preferable to coat it while it is still an ingot. This may also be achieved by drawing the ingot to form an intermediate core wire with a predetermined wire diameter, coating it with the coating layer at a stage after the Al abrasion powder is formed with dies, and then drawing the resultant to be a wire with a final wire diameter.

In manufacturing the bonding wire of the present invention, in addition to the rolling and wire drawing as the common procedure, the wire is subjected to a heat treatment and a subsequent quenching treatment in the middle of wire drawing. The heat treatment can be performed at a stage when the wire diameter is about 1 mm. The condition of the heat treatment during wire drawing is preferably 600 to 640° C. for 2 to 3 hours. The quenching treatment after the heat treatment is performed in water.

By performing such a heat treatment and subsequent quenching during wire drawing while also maintaining the film thickness of the coating layer of the wire not too thick, the crystal orientation <111> proportion after the thermal refining heat treatment described below can be adjusted within the scope of the present invention.

When the heat treatment is not conducted, the crystal orientation <111> proportion exceeds the upper limit after the thermal refining heat treatment described below. In particular, this is remarkable when the coating layer is thin. Further, if the wire is cooled slowly even when the heat treatment is conducted or the heat treatment is performed at too high temperature, the crystal orientation <111> proportion is below the lower limit after the thermal refining heat treatment described below. In particular, this is remarkable when the coating layer is thick.

The thermal refining heat treatment is performed during and/or after the wire drawing. It is possible to reduce the crystal orientation <111> proportion by increasing the temperature of the thermal refining heat treatment and extending the time thereof. The condition of the thermal refining heat treatment can be determined within a range of 250 to 350° C. for the heat treatment temperature and within a range of 5 to 15 seconds for the heat treatment time so as to realize a preferable crystal orientation <111> proportion.

EXAMPLES

As raw materials of the bonding wire, specifically, as Al used for a core wire, Au and Ag used for a coating layer, materials with a purity of 99.99% by mass or more were prepared separately. An ingot was forged by heating and melting Al, and a coating layer was formed on a surface of the wire using an electrolytic plating method. After that, while wire drawing was performed, a heat treatment during the wire drawing and a thermal refining heat treatment after the wire drawing were performed, thus manufacturing a bonding wire with a final wire diameter shown in Table 1. The coating layer was controlled to have the thickness described in Examples.

As for the heat treatment during the wire drawing, the heat treatment was performed at a stage where the wire diameter became 800 μm. In Working Examples, the heat treatment was performed at 620° C. for 3 hours with quenching (water cooling). In Comparative Examples 1 to 4, slow cooling (air cooling) was adopted as the cooling condition. In Comparative Examples 5 and 6, no heat treatment was performed. Further, the conditions of the thermal refining heat treatment after the wire drawing were as follows. The standard condition was within a range of 270±10° C. for 10 seconds. As to Working Example Nos. 19 and 20 (the thickness of the coating layer is greater than those of the preferable range of the present invention), the condition of the thermal refining heat treatment was lower in temperature than the standard condition, in order to adjust the crystal orientation <111> proportion.

The thickness of the coating layer in the resulting bonding wire was measured by ICP analysis to obtain an average film thickness. The metal type and thickness of the coating layer is shown in Table 1.

The measurement of the crystal orientation <111> proportion (the orientation proportion of crystal in which a crystal orientation <111> is angled at 15 degrees or less to a wire longitudinal direction in a cross-section perpendicular to the wire longitudinal direction) was performed by measuring with EBSD on a cross-section perpendicular to the longitudinal direction of the bonding wire, and calculating the crystal orientation <111> proportion in the above-described procedure using the analysis software dedicated to the measuring device.

The surface roughness Rz of the wire was evaluated as the longitudinal roughness of the wire with a non-contact ultra-deep shape measuring microscope in accordance with the provisions of JIS B 0601-2001.

The die abrasion was evaluated by measuring the amount of increase in wire diameter. After drawing a wire of predetermined length, the wire diameter was measured to confirm how the actual wire diameter was increased compared to the target wire diameter. The die abrasion was evaluated according to the degree of increase in the wire diameter and was marked with symbols of "double circle", "circle" and "triangle" in ascending order in terms of the degree of increase in the wire diameter.

The bonding wire was bonded using a commercially available wedge bonder. As the sample for evaluation, a copper substrate having a SiC chip mounted thereon was used. Onto the SiC chip, Titanium, nickel and aluminum were deposited from the SiC chip side in advance, and the thicknesses thereof were 0.1, 2 and 4 μm, respectively.

The bonding property of the bonding wire was evaluated by the wedge bondability. Specifically, its shear strength was evaluated. As for the shear strength, a shear strain was applied to the bonding wire in a state of being wedge bonded in a direction perpendicular to the wire, and the maximum strength that would cause it to fracture was recorded. In the evaluation, the shear strength being 95% or more of the initial bonding strength was marked with a symbol of "double circle", being 90% to 95% of the initial bonding strength was marked with a symbol of "circle", and being 70% to 90% of the initial bonding strength was marked with a symbol of "triangle", and any case of which were determined to be acceptable. On the other hand, the shear strength being less than 70% of the initial bonding strength was determined to be unacceptable.

The high-temperature long-term hysteresis was performed by a power cycle test. The power cycle test involved repeatedly heating and cooling the semiconductor device in which an Al bonding wire had been bonded. Specifically, the semiconductor device was heated over 2 seconds until the temperature of the bonded parts of the bonding wires in the semiconductor device became 140° C., and then was cooled over 5 seconds until the temperature of the bonded parts became 30° C. This heating and cooling cycle was repeated 200,000 times.

After performing the high-temperature long-term hysteresis, the bonding shear strength of the first bonded part was measured to evaluate the reliability of the bonded part. The shear strength was measured as a comparison with the initial shear strength of the bonded part. In the evaluation, the shear strength being 95% or more of the initial bonding strength was marked with a symbol of "double circle", being 90% to 95% of the initial bonding strength was marked with a symbol of "circle", being 70% to 90% of the initial bonding strength was marked with a symbol of "triangle", and being less than 70% of the initial bonding strength was marked with a symbol of "cross" in the column "reliability test" in Table 1. The evaluations of "double circle" and "circle" were determined to be acceptable and the others were determined to be unacceptable.

achieved evaluation of "double circle" in all of the die abrasion, bonding property, and reliability test.

Working Example Nos. 19 and 20 had the thickness of the coating layer being thicker than those under the preferable condition of the present invention. Although the crystal orientation <111> proportion thereof was within the range of the present invention by performing the thermal refining heat treatment at a lower temperature than those under the standard condition, they merely achieved evaluation of "triangle" in the bonding property.

As for Working Example Nos. 21 and 22 in which the thickness of the coating layer was below the preferable

TABLE 1

| | | Wire Specification | | Wire Crystal Texture | | | | | |
|---|---|---|---|---|---|---|---|---|---|
| | | Wire diameter | Thickness of coating layer (nm) | Orientation <111> | Surface roughness | Wire Properties | | | Remarks |
| | No. | (μm) | Ag | Au | proportion (%) | Rz (μm) | Die abrasion | Bonding property | Reliability test | (Heat treatment conditions) |
| Working Example | 1 | 50 | 10 | 0 | 33 | 1.5 | O | O | O | |
| | 2 | 50 | 5 | 0 | 50 | 1.8 | ◉ | ◉ | ◉ | |
| | 3 | 50 | 1 | 0 | 86 | 1.1 | O | O | O | |
| | 4 | 50 | 0 | 10 | 31 | 1.7 | O | O | O | |
| | 5 | 50 | 0 | 5 | 53 | 1.1 | ◉ | ◉ | ◉ | |
| | 6 | 50 | 0 | 1 | 90 | 1.3 | O | O | O | |
| | 7 | 200 | 40 | 0 | 32 | 1.8 | O | O | O | |
| | 8 | 200 | 20 | 0 | 51 | 1.0 | ◉ | ◉ | ◉ | |
| | 9 | 200 | 1 | 0 | 89 | 1.7 | O | O | O | |
| | 10 | 200 | 0 | 40 | 31 | 1.7 | O | O | O | |
| | 11 | 200 | 0 | 20 | 52 | 1.3 | ◉ | ◉ | ◉ | |
| | 12 | 200 | 0 | 1 | 87 | 1.8 | O | O | O | |
| | 13 | 600 | 100 | 0 | 32 | 1.4 | O | O | O | |
| | 14 | 600 | 50 | 0 | 52 | 1.7 | ◉ | ◉ | ◉ | |
| | 15 | 600 | 1 | 0 | 88 | 1.6 | O | O | O | |
| | 16 | 600 | 0 | 100 | 33 | 1.8 | O | O | O | |
| | 17 | 600 | 0 | 50 | 51 | 1.1 | ◉ | ◉ | ◉ | |
| | 18 | 600 | 0 | 1 | 86 | 1.9 | O | O | O | |
| | 19 | 200 | 120 | 0 | 32 | 1.5 | O | Δ | O | Termal refining heat treatment_low temperature |
| | 20 | 200 | 0 | 120 | 34 | 1.7 | O | Δ | O | ditto |
| | 21 | 200 | 0.5 | 0 | 88 | 2.3 | Δ | Δ | O | |
| | 22 | 200 | 0 | 0.5 | 79 | 2.5 | Δ | Δ | O | |
| Comparative Example | 1 | 200 | 120 | 0 | 29 | 1.5 | O | Δ | Δ | Slow cooling after heat treatment during wire drawing |
| | 2 | 200 | 0 | 120 | 28 | 1.7 | O | Δ | Δ | ditto |
| | 3 | 200 | 100 | 0 | 26 | 1.2 | Δ | Δ | X | ditto |
| | 4 | 200 | 0 | 100 | 27 | 1.4 | Δ | Δ | X | ditto |
| | 5 | 200 | 1 | 0 | 93 | 1.8 | Δ | Δ | X | No heat treatment during wire drawing |
| | 6 | 200 | 0 | 1 | 91 | 1.9 | Δ | Δ | X | ditto |

The results are shown in Table 1. Values outside the range of the present invention are underlined.

All of Working Example Nos. 1 to 22 had the crystal orientation <111> proportion being within the range of the present invention, and they achieved favorable results in all of die abrasion, bonding property, and reliability test. In particular, Working Example Nos. 1 to 18 had the thickness of the coating layer being within the preferable range of the present invention, and all of them achieved favorable results in the reliability test. Further, Working Example Nos. 2, 5, 8, 11, 14 and 17 had the thickness of the coating layer and the crystal orientation <111> proportion being within the more preferable range of the present invention, and they lower limit, the evaluation results of die abrasion, surface properties, and bonding property were "triangle".

Comparative Example Nos. 1 and 2 had the thickness of the coating layer being thicker than those under the preferable condition of the present invention, and had the crystal orientation <111> proportion being out of the lower limit of the range of the present invention since the thermal refining heat treatment was performed under the standard condition. As for them, the result of the reliability test was "triangle" (unacceptable), and the result of the bonding property was "triangle".

Comparative Example Nos. 3 and 4 had the crystal orientation <111> proportion being out of the lower limit of the range of the present invention since the cooling condition after the heat treatment during the wire drawing was slow cooling (air cooling). As for them, the result of the reliability test was "cross", and both results of the die abrasion and the bonding property were "triangle".

Comparative Example Nos. 5 and 6 had the crystal orientation <111> proportion being out of the upper limit of the range of the present invention since the heat treatment during the wire drawing was not performed. As for them, the result of the reliability test was "cross", and both results of the die abrasion and the bonding property were "triangle".

The invention claimed is:

1. A bonding wire comprising:
   a core wire of Al or Al alloy; and
   a coating layer of Ag, Au or an alloy containing them formed on an outer periphery of the core wire, wherein
   when measuring crystal orientations on a cross-section of the core wire in a direction perpendicular to a wire axis of the bonding wire, a crystal orientation <111> angled at 15 degrees or less to a wire longitudinal direction has a proportion of 30 to 90% among crystal orientations in the wire longitudinal direction.

2. The bonding wire according to claim 1, wherein a surface roughness of the wire is 2 μm or less in terms of Rz.

3. The bonding wire according to claim 1, wherein a thickness of the coating layer is 1 to 100 nm.

4. The bonding wire according to claim 1, wherein a wire diameter is 50 to 600 μm.

* * * * *